United States Patent [19]

Butler et al.

[11] Patent Number: 4,833,097

[45] Date of Patent: May 23, 1989

[54] FABRICATION OF MOS-TRANSISTORS

[76] Inventors: Alan L. Butler, Slangenburg 21, 5655 EX Eindhoven, Netherlands; Peter A. Childs, 21 Jordans Close, Boxgrove Park, Guildford, Surrey GU1 2PB, Great Britain

[73] Assignee: Plesscy Overseas Limited I Hord, Essex, England

[21] Appl. No.: 150,410

[22] PCT Filed: May 11, 1987

[86] PCT No.: PCT/GB87/00314

§ 371 Date: Apr. 4, 1988

§ 102(e) Date: Apr. 4, 1988

[87] PCT Pub. No.: WO87/07084

PCT Pub. Date: Nov. 19, 1987

[30] Foreign Application Priority Data

May 12, 1986 [GB] United Kingdom ............... 8611580

[51] Int. Cl.$^4$ ............... H01L 29/54; H01L 29/00; H01L 21/02; H01L 21/00

[52] U.S. Cl. ............... 437/31; 437/28; 437/29; 437/41; 437/984

[58] Field of Search ............... 437/28, 29, 41, 913, 437/43, 984

[56] References Cited

U.S. PATENT DOCUMENTS

| 3,873,373 | 3/1975 | Hill ............... 437/41 |
| 4,616,399 | 10/1986 | Ooka ............... 437/29 |
| 4,728,617 | 3/1988 | Woo et al. ............... 437/43 |

FOREIGN PATENT DOCUMENTS

| 0107229 | 8/1980 | Japan ............... 437/29 |
| 0021367 | 2/1981 | Japan ............... 437/29 |
| 0048174 | 5/1981 | Japan ............... 437/29 |
| 0130417 | 8/1982 | Japan ............... 437/29 |
| 0204170 | 12/1982 | Japan ............... 437/29 |
| 7902878 | 10/1980 | Netherlands ............... 437/29 |

OTHER PUBLICATIONS

Rideout, V. L., Double Polysilicon Dynamic Random-Access Memory Cell with Increased Charge Storage Capacitance, IBM Tech. Disc. Bull., vol. 21, No. 9, 2/79, pp. 3823-3825.

Primary Examiner—Brian E. Hearn
Assistant Examiner—B. Everhart
Attorney, Agent, or Firm—Fleit, Jacobson, Cohn & Price

[57] ABSTRACT

A process for the fabrication of shallow p+ and n+ doped layers suitable for the sources and drains of submicron CMOS transistors comprises applying a layer of polysilicon (1) over a gate oxide layer (2) which is surrounded by a field oxide isolation layer (3) located on a suitable substrate (4) and applying a resist layer (5) to the polysilicon layer in a selected region of the polysilicon layer overlying the gate oxide to define a gate electrode. Selective ion implantation then takes place to form the source and drain regions (6, 7), the implementation extending through the oxide layer to a limited extent except in the region masked by the resist layer. The polysilicon layer and resist layer are then etched away to leave a gate electrode (8) extending from the oxide layer (2) and the source and drain regions are then activated and difussed to ~0.1 μm junction depth. The oxide is then removed in said source and drain regions and a silicide or other conductive layer (10) is then applied to reduce the sheet resistance to ~8Ω/ or less.

6 Claims, 1 Drawing Sheet

FABRICATION OF MOS-TRANSISTORS

This invention relates to a process for the production of transistors and is particularly concerned with the fabrication of shallow p+ and n+ doped layers suitable for the sources and drains of submicron CMOS transistors.

Shallow junctions in such transistors have a very high resistance and the aim of the present invention is to reduce the resistance at such junctions.

According to the invention, there is provided a process for the production of a transistor which comprises applying a layer of polysilicon over a gate oxide layer which is surrounded by a field oxide isolation layer located on a suitable substrate; applying a resist layer to the polysilicon layer in a selected region of the latter overlying the gate oxide to define a gate electrode; selective ion implantation to form source and drain regions, said implantation extending through the gate oxide layer to a limited extent except in the region masked by said resist layer; etching away the polysilicon layer and resist layer to leave a gate electrode extending from said oxide layer, activating the source and drain regions and removing the gate oxide in said regions; and finally depositing a conductive layer on the said gate electrode and source and drain regions.

By formation of doped layers to form the source and drain regions by implantation through the polysilicon layer prior to defining the gate electrode, it is possible to achieve shallow p+ and n+ doped layers which are suitable for the source and drain regions of submicron CMOS transistors. However, the process according to the invention could also be used in other areas such as, for example, for the production of bipolar transistors.

The source and drain regions may be activated prior to etching away the polysilicon layer to define the gate electrode although it is preferred to activate said regions after the polysilicon layer had been etched away and before the gate oxide layer is removed in the source and drain regions. However, as a further alternative, activation of the dopant layers in the source and drain regions may take place after etching away of the polysilicon layer as well as removal of the gate oxide layer.

The final conductive layer may comprise a silicide or selective refractory metal deposition, e.g. selective tungsten.

The invention also extends to a transistor when made by the above-described process.

The invention will now be further described, by way of example, with reference to the drawings which show successive steps in the production of a transistor according to the invention and in which.

Figure 1:
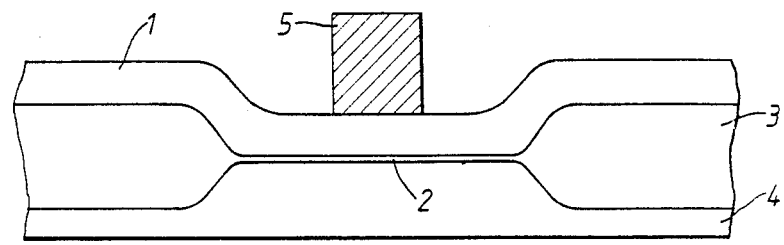
FIG. 1 shows an initial stage in the process according to the invention.

Referring to the drawings, a polysilicon layer 1 is applied over a gate oxide layer 2 which is surrounded by a field oxide isolation layer 3 located on a suitable substrate 4. A resist layer 5 is applied to the polysilicon layer 1 in a selected region of the latter overlying the gate oxide layer 2 to define a gate electrode as shown in FIG. 1.

Figure 2:
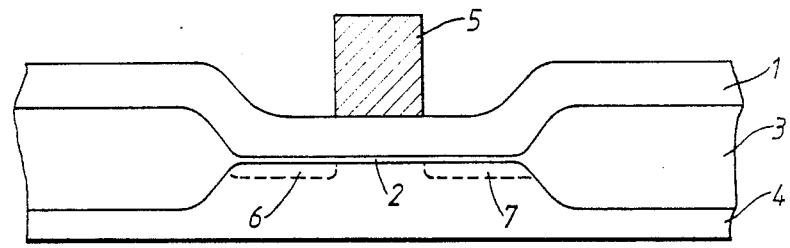
FIG. 2 shows the step of selective ion implantation to form shallow source and drain electrodes in the substrate.

Selective n type or p type ion implantation is then carried out as shown in FIG. 2, the resist layer 5 acting as a mask so that only selected regions of the substrate underlying the oxide layer 2 are implanted to form the source and drain regions of NMOS or PMOS transistors. The implants 6 and 7 just penetrate through to the active area of the device.

Figure 3:
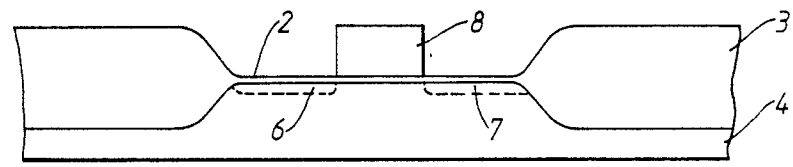
FIG. 3 shows the transistor after etching away of the polysilicon layer.
Figure 4:
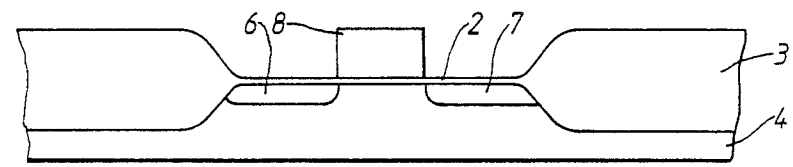
FIG. 4 shows the transistor after activation of the source and drain regions.

The polysilicon layer 1 is then etched away except in the region underlying the resist layer 5 after which the latter is removed to leave a polysilicon gate 8 as shown in FIG. 3. The source and drain regions 6 and 7 are then activated and diffused to $\sim 0.1$ $\mu$m junctions depth to form the structure shown in FIG. 4.

Figure 5:
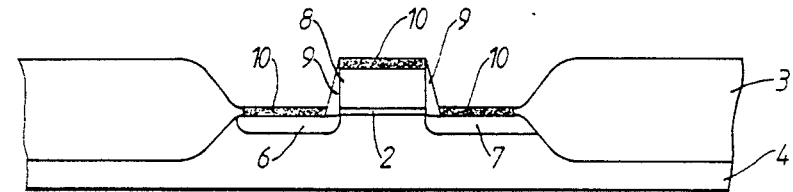
FIG. 5 shows a completed transistor made by the process according to the invention.

Finally, the gate oxide layer 2 is removed in the source and drain regions and gate side wall oxide fillets 9 are formed after which a silicide layer 10 is applied to the gate, source and drain regions 8, 6 and 7, to reduce the sheet resistance of the layers to $\sim 8$ $\Omega/\square$ or less, as shown in FIG. 5.

The process according to the invention is suitable for small geometry ($\leqq 1$ $\mu$m gate length) CMOS transistors although it is considered that it is also suitable for bipolar transistors, for example. The implantation of the sources and drains prior to defining the gate electrode enables ultra shallow diffusions to be formed.

The invention is not restricted to the above-described example but variations and modifications are possible without departing from the scope of the invention. For example, the source and drain regions 6 and 7 may be activated prior to etching away the polysilicon layer 1 and resist 5 (FIG. 3) although this is not preferred. As a further alternative, the source and drain regions 6 and 7 may be activated after the gate oxide layer 2 has been removed from these regions.

The silicide 10 may comprise polysilicon or any other suitable conductive layer. Alternatively, the silicide may be replaced by selective refractory metal deposition, e.g. selective tungsten.

We claim:

1. A process for the production of a transistor which comprises applying a layer of polysilicon over a gate oxide layer which is surrounded by a field oxide isolation layer located on a suitable substrate; applying a resist layer to the polysilicon layer in a selected region of the latter overlying the gate oxide to define a gate electrode; selective ion implantation to form source and drain regions, said implantation extending through the gate oxide layer to a limited extent except in the region masked by said resist layer; etching away the polysilicon layer and resist layer to leave a gate electrode extending from said oxide layer, activating the source and drain regions and removing the gate oxide in said regions; and finally depositing a conductive layer on the said gate electrode and source and drain regions.

2. A process according to claim 1, wherein the source and drain regions are activated after the polysilicon layer has been etched away.

3. A process according to claim 2, wherein the source and drain regions are activated after the oxide layer has been removed from these regions.

4. A process according to any preceding claim 1, wherein the said conductive layer comprises a silicide.

5. A process according to claim 1 wherein the said conductive layer comprises a selective refractory metal deposition.

6. A process according to claim 1, wherein the gate is provided with oxide fillets prior to the deposition of said conductive layer.

* * * * *